(12) United States Patent
Fujikata et al.

(10) Patent No.: US 9,406,832 B2
(45) Date of Patent: Aug. 2, 2016

(54) WAVEGUIDE-COUPLED MSM-TYPE PHOTODIODE

(71) Applicant: NEC Corporation, Tokyo (JP)

(72) Inventors: Junichi Fujikata, Tokyo (JP); Takahiro Nakamura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/388,028

(22) PCT Filed: Mar. 18, 2013

(86) PCT No.: PCT/JP2013/057622
§ 371 (c)(1),
(2) Date: Sep. 25, 2014

(87) PCT Pub. No.: WO2013/146406
PCT Pub. Date: Oct. 3, 2013

(65) Prior Publication Data
US 2015/0084143 A1    Mar. 26, 2015

(30) Foreign Application Priority Data

Mar. 30, 2012  (JP) ................. 2012-080591

(51) Int. Cl.
*H01L 31/108* (2006.01)
*H01L 27/146* (2006.01)
(Continued)

(52) U.S. Cl.
CPC ...... *H01L 31/1085* (2013.01); *H01L 27/14625* (2013.01); *H01L 31/02327* (2013.01); *H01L 31/0368* (2013.01); *H01L 31/0376* (2013.01); *G02B 6/12004* (2013.01)

(58) Field of Classification Search
CPC ........... H01L 31/1085; H01L 31/0376; H01L 31/02327; H01L 27/14625; H01L 31/0368; G02B 6/12004
See application file for complete search history.

(56) References Cited

U.S. PATENT DOCUMENTS 4,979,825 A * 12/1990 Iwashita ............. G01J 9/02
356/477
5,252,852 A * 10/1993 Makiuchi ........... H01L 27/1443
257/458
(Continued)

FOREIGN PATENT DOCUMENTS

JP    63-160373    7/1988
JP    04-328876    11/1992
(Continued)

OTHER PUBLICATIONS

International Search Report, PCT/JP2013/057622, May 14, 2013.
(Continued)

*Primary Examiner* — Howard Weiss
*Assistant Examiner* — Sue Tang
(74) *Attorney, Agent, or Firm* — Young & Thompson (57) ABSTRACT

A waveguide-coupled MSM-type photodiode of the present invention comprises a structure in which a semiconductor light-absorbing layer and an optical waveguide core layer are adjacent and optically coupled to each other, has formed metal-semiconductor-metal (MSM) junctions which are arranged at an interval on the semiconductor light-absorbing layer, and is characterized in that of the MSM electrodes arranged at the interval, a voltage is set so that a reverse bias is applied to those MSM electrodes that are arranged on a light incidence side.

19 Claims, 9 Drawing Sheets

(51) Int. Cl.
*H01L 31/0232* (2014.01)
*H01L 31/0368* (2006.01)
*H01L 31/0376* (2006.01)
*G02B 6/12* (2006.01)

(56) References Cited

U.S. PATENT DOCUMENTS

| | | | | |
|---|---|---|---|---|
| 5,404,006 | A | * | 4/1995 | Schaffner .......... G02B 6/42 250/208.2 |
| 5,703,980 | A | * | 12/1997 | MacElwee .......... G02B 6/30 385/30 |
| 6,239,422 | B1 | * | 5/2001 | Vang .......... G02B 6/42 250/208.2 |
| 7,276,770 | B1 | * | 10/2007 | Goushcha .......... H01L 31/103 257/290 |
| 2004/0089876 | A1 | * | 5/2004 | Kuwatsuka .......... H01L 31/1075 257/186 |
| 2006/0205127 | A1 | | 9/2006 | Kwon et al. |
| 2010/0013040 | A1 | * | 1/2010 | Okamoto .......... H01L 31/022408 257/432 |
| 2010/0119192 | A1 | * | 5/2010 | Fujikata .......... B82Y 20/00 385/14 |

FOREIGN PATENT DOCUMENTS

| | | |
|---|---|---|
| WO | WO 96/05536 | 2/1996 |
| WO | WO 2008/072688 | 6/2008 |

OTHER PUBLICATIONS

S.J. Koester et al., "Germainum—on Insulator Photodetectors", 2005, 2nd International Conference on Group IV Photonics, FBI, p. 172, Fig 3.

E.H. Bottcher, "Millimeter wave distributed metal—semiconductor—metal photodetectors", Applied Physics Letters, vol. 66, No. 26 (1995), p. 3648-3650.

* cited by examiner

WAVEGUIDE-COUPLED MSM-TYPE PHOTODIODE

TECHNICAL FIELD

The present invention relates to a waveguide-coupled MSM-type photodiode, and more particularly, to a photodiode that converts an optical signal including infrared light into an electrical signal at a high speed, which is necessary in information processing using an optical interconnection in an LSI chip or between chips.

BACKGROUND ART

It is quite attractive to configure a photodetector with a monolithic integrated circuit using a silicon electronic technique in terms of cost and yield. A silicon-germanium optical receiver, that is, a silicon-germanium photodiode, which is configured with a monolithic integrated circuit on the same chip as a CMOS circuit is an attractive substitute for a hybrid optical receiver such as an InGaAs photodiode connected to a CMOS circuit or a GaAs circuit. An optical receiver configured with a monolithic integrated circuit can be manufactured using a standard silicon forming process, and thus is expected to be manufactured at a lower cost than a hybrid optical receiver.

A photodiode has been widely used as a device that converts an optical signal into an electrical signal quickly. A pin-type photodiode is a representative photodiode. A pin-type photodiode has a structure in which an i layer formed of an intrinsic semiconductor is interposed between a p layer made of a p-type semiconductor and an n layer formed of an n-type semiconductor. When a reverse bias voltage is applied from a bias supply to the stacked structure, almost all regions of the high-resistance i layer become a depletion layer of charge carriers. Photons of incident light are mainly absorbed into the i layer to generate electron-hole pairs. The generated electrons and holes drift in opposite directions in the depletion layer due to the reverse bias voltage to generate an electric current, and are detected as a signal voltage by a load resistor. Main factors restricting a response speed of photoelectric conversion are a circuit time constant decided by the product of capacitance generated by the load resistor and the depletion layer and a carrier-transit time required for electrons and holes to pass through the depletion layer.

As a photodiode having a short carrier-transit time, there is a Schottky-type photodiode. A Schottky-type photodiode has a structure in which a semi-transparent metallic film comes into contact with an n layer or an n⁻ layer of a semiconductor. A Schottky barrier is formed near an interface in which the semi-transparent metallic film comes into contact with the n layer or the n⁻ layer. Near the Schottky barrier, electrons of the n layer or the n⁻ layer are diffused from the semi-transparent metallic film and become the depletion layer. In this state, when incident light is radiated, electrons are generated in the n layer or the n⁻ layer, and drift in the depletion layer due to the reverse bias voltage. Further, as electrons are generated, light absorption in the element surface layer can be effectively used.

In the pin-type photodiode, for absorption of photons, the i layer, that is, the depletion layer, needs to have a sufficient thickness, but in the Schottky-type photodiode, the thickness of the depletion layer can be reduced. Thus, as described above, the carrier-transit time can be shortened using the Schottky-type photodiode. Further, as disclosed in Non-Patent Document 1, in the pin-type photodiode, in order to reduce the thickness of the depletion layer, an attempt to reduce an electrode interval has been performed using a lateral electrode structure, but light absorption efficiency in the semiconductor surface layer is bad, and it is difficult to achieve high sensitivity even when high speed operation is achieved.

Meanwhile, in the pin-type photodiode and Schottky-type photodiode, when an additional resistance value is reduced in order to decrease the circuit time constant, the voltage of a regenerative signal to be extracted decreases. Thus, a reduction in the capacitance of the depletion layer is important since it improves the SN ratio of the regenerative signal and reduces the reading error. Particularly, when the thickness of the depletion layer is reduced in order to shorten the carrier-transit time, the capacitance increases, and thus the area of the depletion layer or the Schottky junction needs to be decreased in order to increase the speed. However, when the area of the Schottky junction is decreased, utilization efficiency of signal light decreases, and there is consequently a problem in that the SN ratio of the regenerative signal deteriorates.

In order to solve the above problems, a metallic-semiconductor-metallic (MSM)-type photodiode in which two electrodes are periodically arranged on the same plane of a semiconductor has been proposed. In the MSM-type photodiode, an effective opposing area between the two electrodes is small, and a photodiode having small capacitance can be implemented. Further, since an electric current flows from one of the electrodes to the Schottky barrier in the forward direction, the additional resistance can be reduced to be smaller than in the pin-type photodiode, and a photodiode having a small circuit time constant can be implemented.

In the MSM-type photodiode, as described above, due to a voltage applied between two adjacent electrodes, a carrier depletion layer is formed, and photo carriers are swept to the electrode by an internal electric field.

Thus, in order to increase the speed, it is important to reduce an interval between two adjacent electrodes, reduce the thickness of the semiconductor light absorbing layer, and reduce the transit time of photo carriers.

DOCUMENTS OF THE PRIOR ART

Non Patent Document

[Non-Patent Document 1]
S. J. Koester, G. Dehlinger, J. D. Schaub, J. O. Chu, Q. C. Ouyang, A. Grill, "Germanium-on-Insulator Photodetectors," 2005, 2nd International Conference on Group IV Photonics, FB1, p. 172, FIG. 3

DISCLOSURE OF INVENTION

Problem to be Solved by the Invention

The MSM-type photodiode provides planarity and compatibility with a silicon LSI. However, for integration and optical coupling with an optical waveguide, it is necessary to reduce light reflection caused by an MSM electrode and implement the high speed operation and the high efficiency.

In order to increase the response speed of the MSM-type photodiode, it is necessary to reduce spacing between the MSM electrodes and the thickness of the light absorbing layer, increase a voltage to be applied to reduce the carrier transit time, and reduce a light receiving area, that is, a junction capacitance to decrease the circuit time constant. However, the light reception sensitivity and the high speed operation commonly have a trade-off relation, and it is difficult to satisfy both the light reception sensitivity and the high speed operation.

It is an object of the present invention to provide a device structure capable of implementing an MSM-type photodiode coupled with an optical waveguide with high efficiency and satisfying both the light reception sensitivity and the high speed operation at a low voltage. It is another object to provide a photodiode that is high in integration and low in power consumption by application to a differential photodiode.

Means for Solving the Problem

A waveguide-coupled MSM-type photodiode according to the present invention has a structure in which a semiconductor light absorbing layer is adjacent to and optically coupled with an optical waveguide core layer, and MSM junctions arranged at intervals are formed on the semiconductor light absorbing layer, wherein a voltage is set such that a reverse bias is applied to an MSM electrode arranged at a light incidence side among MSM electrodes arranged at the intervals.

Here, the reverse bias refers to a state in which a negative voltage is set when the semiconductor light absorbing layer is made of an n-type semiconductor, and a state in which a positive voltage is applied when the semiconductor light absorbing layer is made of a p-type semiconductor. Further, in the case of an intrinsic semiconductor, any of positive and negative biases can be applied thereto, but practically, it is very difficult to cause an impurity concentration to be about $10^{14}/cm^3$ or less, and thus it commonly has a conductive type of an n type semiconductor or a p type semiconductor.

Effects of the Invention

According to the present invention, in an MSM-type photodiode optically coupled with an integrated optical waveguide, it is possible to sweep photo carriers at a high speed and high efficiency, and a photodiode that is high in speed and efficiency at a low voltage is implemented.

EMBODIMENTS FOR CARRYING OUT THE INVENTION

Hereinafter, waveguide-coupled MSM-type photodiodes according to exemplary embodiments of the present invention will be described in detail with reference to the appended drawings.

In the drawings which will be described below, in order to help understand features, for convenience, there are cases in which features are enlarged and shown. For example, the dimension ratio of each component is not necessarily the same as the actual one.

(First Embodiment)

Figure 1:
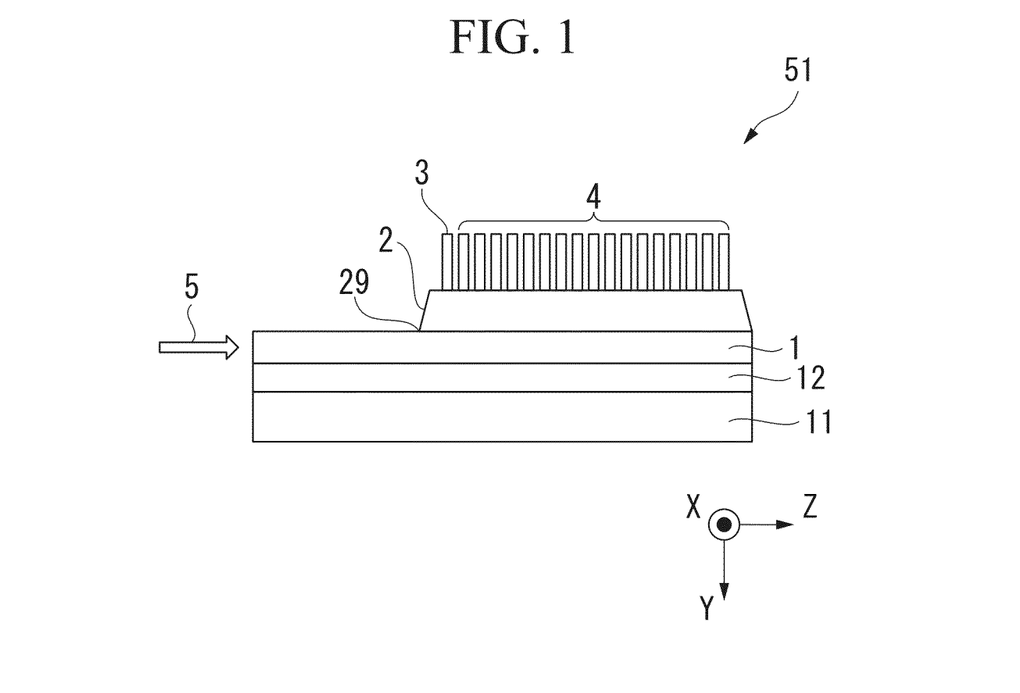
FIG. 1 is a cross-sectional view of a waveguide-coupled MSM-type photodiode according to a first embodiment of the present invention.
Figure 2:
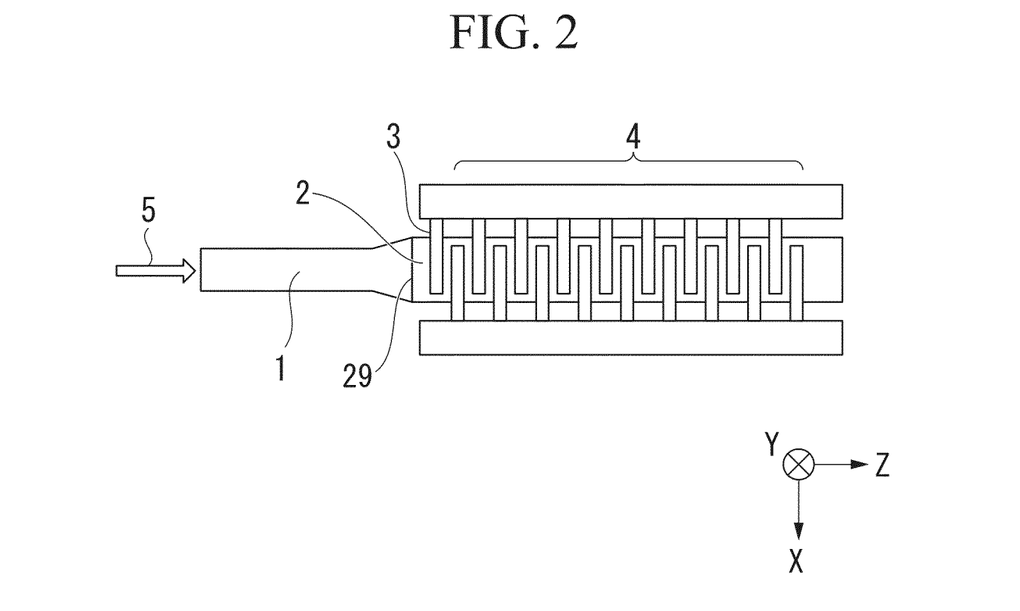
FIG. 2 is a top view of the waveguide-coupled MSM-type photodiode according to the first embodiment of the present invention.

FIGS. 1 and 2 illustrate an exemplary structure of an MSM-type photodiode (a waveguide-coupled MSM-type photodiode) 51 according to a first embodiment of the present invention.

As shown in FIG. 1, the MSM-type photodiode 51 is formed on a semiconductor light absorbing layer 2 optically coupled with an adjacent optical waveguide core layer 1. The optical waveguide core layer 1 is formed on an embedding oxide layer 12 stacked on a support substrate 11. The MSM-type photodiode 51 is a photodiode in which MSM junctions are formed on the semiconductor light absorbing layer 2 to be arranged at intervals. The voltage is set so that a reverse bias is applied to an MSM electrode (1) 3 arranged at a light incidence side (an input optical signal 5 side) among the MSM electrodes 3 and 4 arranged at intervals.

The optical waveguide core layer 1 and the semiconductor light absorbing layer 2 are stacked and formed on the substrate in the vertical direction, and are optically coupled by evanescent optical coupling. Thus, an optical mode field of light propagated through the optical waveguide core layer 1 alternately shifts between the optical waveguide core layer 1 and the semiconductor light absorbing layer 2 at a cycle according to a refractive index difference with the semiconductor light absorbing layer 2.

(Second Embodiment)

Figure 3:
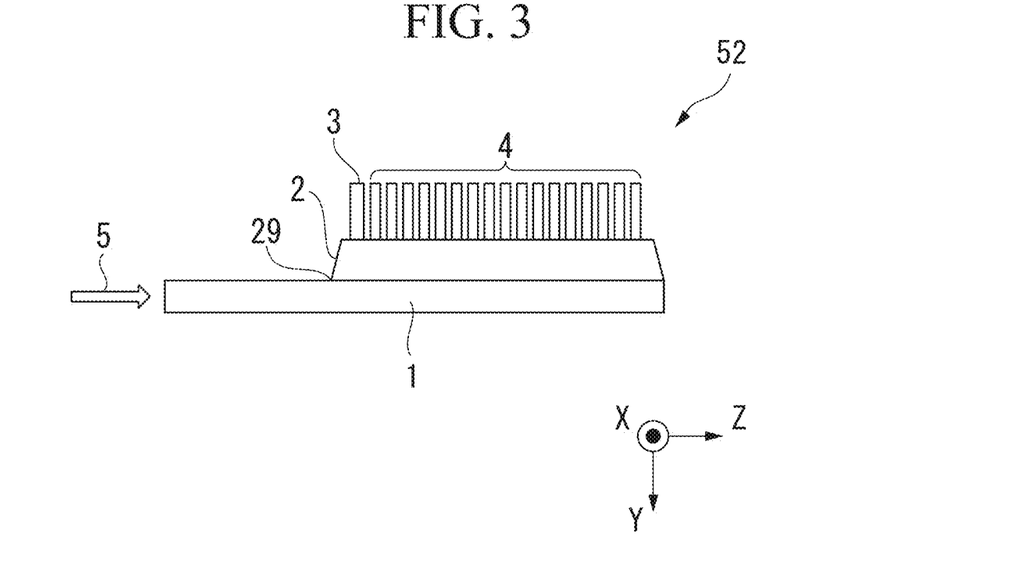
FIG. 3 is a cross-sectional view of waveguide-coupled MSM-type photodiode according to a second embodiment of the present invention.
Figure 4:
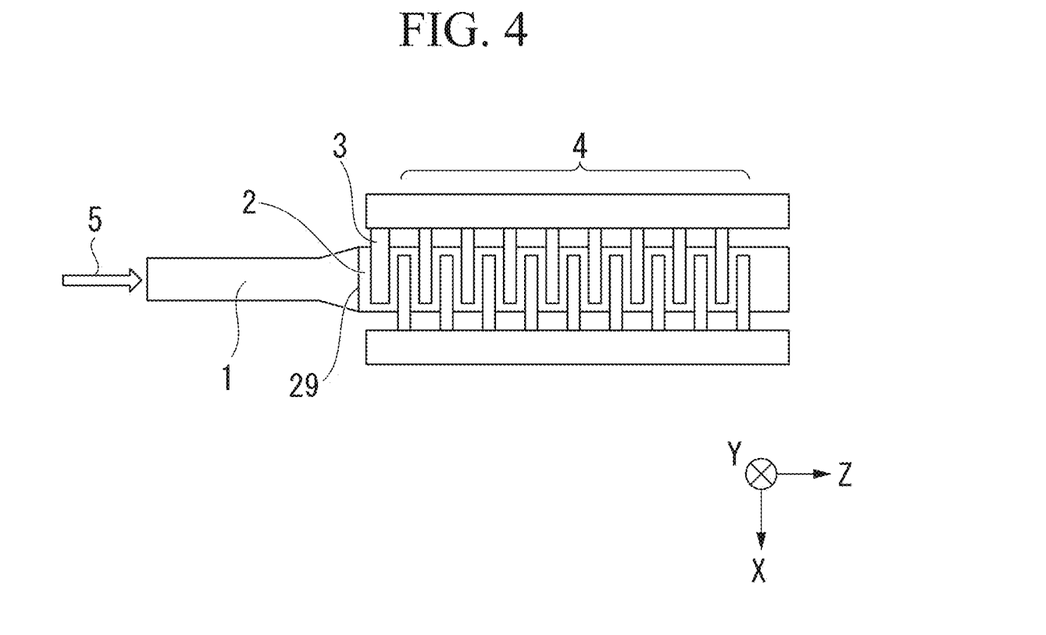
FIG. 4 is a top view of the waveguide-coupled MSM-type photodiode according to the second embodiment of the present invention.

FIGS. 3 and 4 show an exemplary structure of an MSM-type photodiode 52 according to a second embodiment of the present invention. Among components of MSM-type photodiodes according to second to fourth embodiments which will be described below, the same components as in the MSM-type photodiode 51 according to the first embodiment are denoted by the same reference numerals, and a description thereof is omitted here.

In an MSM-type photodiode 52, MSM electrodes 3 and 4 are formed such that an MSM electrode (1) 3 arranged at the light incidence side is larger in width than the other MSM electrodes 4. As the width of the MSM electrode (1) 3 is increased, in a photo carrier generation region of optical coupling, a region having strong internal electric field intensity increases, and thus reception sensitivity and a frequency band are improved.

(Third Embodiment)

Figure 5:
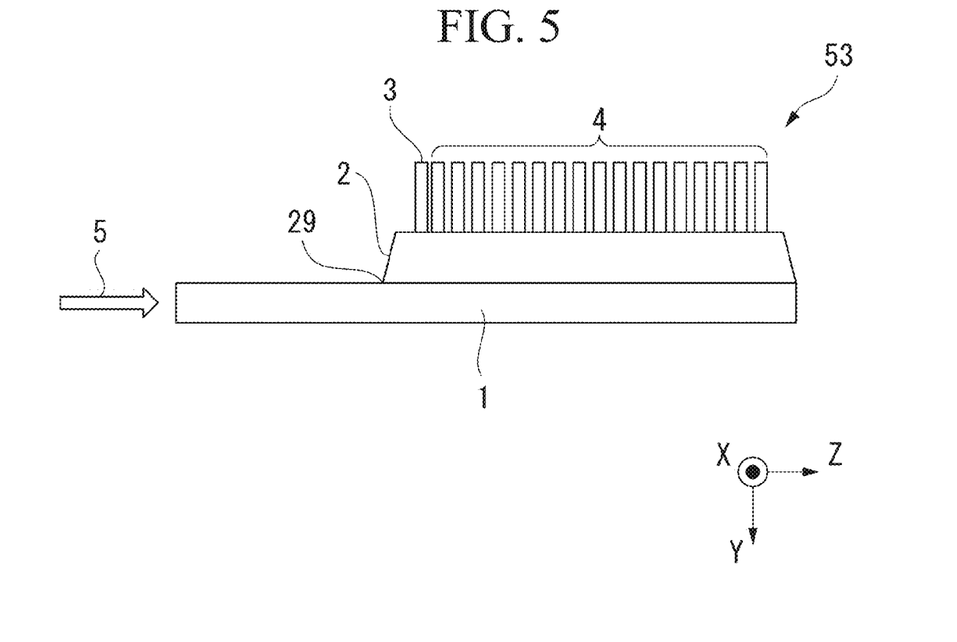
FIG. 5 is a cross-sectional view of waveguide-coupled MSM-type photodiode according to a third embodiment of the present invention.
Figure 6:
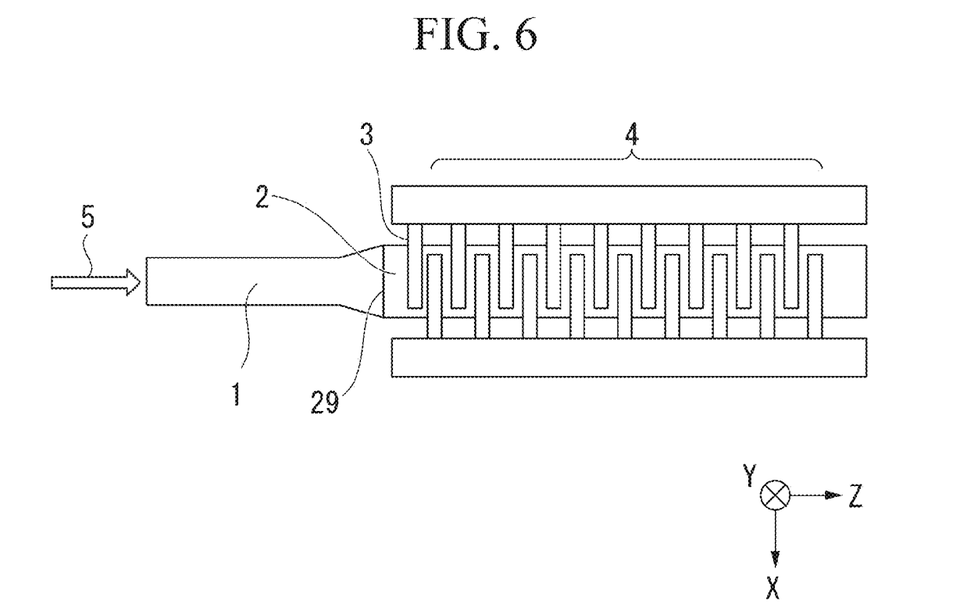
FIG. 6 is a top view of the waveguide-coupled MSM-type photodiode according to the third embodiment of the present invention.

FIGS. 5 and 6 illustrate an exemplary structure of an MSM-type photodiode 53 according to a third embodiment.

In the MSM-type photodiode 53, MSM electrodes 3 and 4 are formed such that an interval between an MSM electrode (1) 3 arranged at a light incidence side and an adjacent MSM electrode 4 is smaller than an interval between the adjacent MSM electrodes 4. Since the interval between the MSM electrode (1) 3 and the adjacent MSM electrode 4 is small, internal electric field intensity in a photo carrier generation region of optical coupling is increased, and the reception sensitivity and the frequency band are improved.

Figure 7:
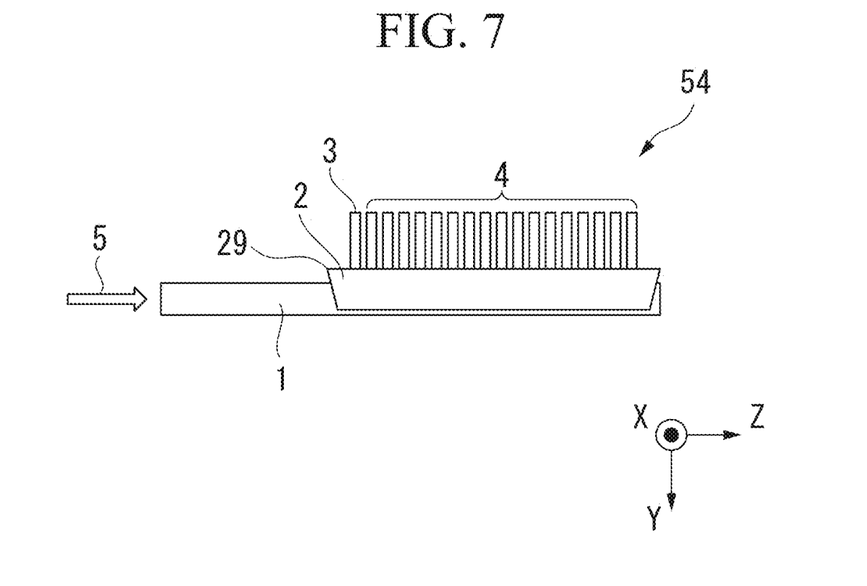
FIG. 7 is a cross-sectional view of a waveguide-coupled MSM-type photodiode according to a fourth embodiment of the present invention.
Figure 8:
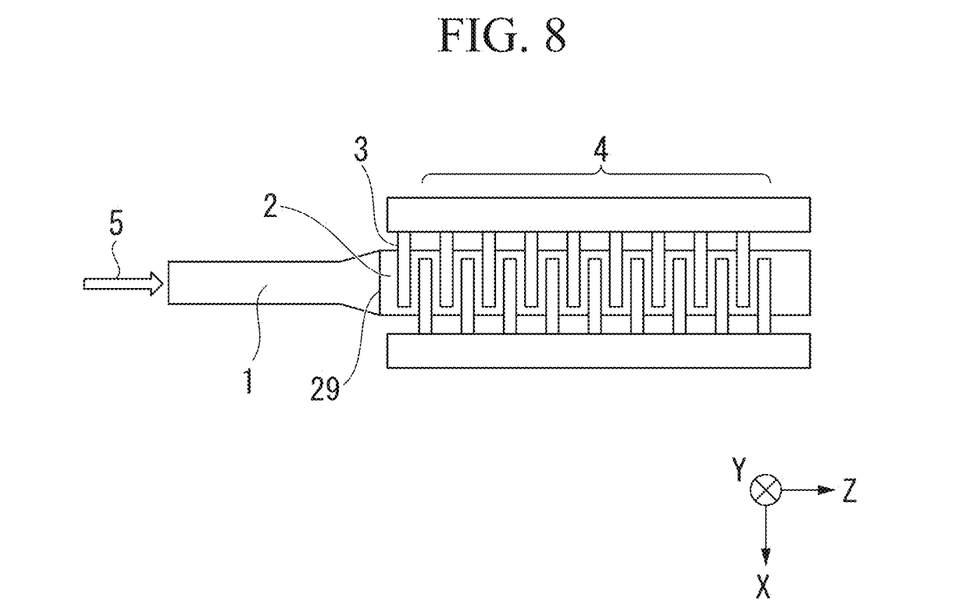
FIG. 8 is a top view of the waveguide-coupled MSM-type photodiode according to the fourth embodiment of the present invention.

FIGS. 7 and 8 illustrate an exemplary structure of an MSM-type photodiode 54 according to a fourth embodiment.

In the MSM-type photodiode 54, the semiconductor light absorbing layer 2 and the optical waveguide core layer 1 are optically coupled to be adjacent in a direction horizontal to a support substrate (not shown), and a voltage is set so that a reverse bias is applied to an MSM electrode (1). Through such an element structure, internal electric field intensity in a photo carrier generation region of optical coupling is increased, and the reception sensitivity and the frequency band are improved.

Further, in the MSM-type photodiodes 51, 52, 53, and 54, a distance between the MSM electrode (1) 3 arranged at the light incidence side among the MSM electrodes arranged on the semiconductor light absorbing layer 2 at intervals and an edge portion 29 of the semiconductor light absorbing layer 2 is preferably $\lambda/n_{eff}$ or less when $\lambda$ indicates a wavelength of incident light, and $n_{eff}$ indicates an effective refractive index of an optical signal field in the semiconductor light absorbing layer 2. As this condition is satisfied, light is mode-coupled between the optical waveguide core layer 1 and the semiconductor light absorbing layer 2, and thus it is possible to increase the internal electric field intensity in a region in which photo carriers the most are generated. As a result, the reception sensitivity and the frequency band of the MSM-type photodiode are remarkably improved.

In the MSM-type photodiodes 51, 52, 53, and 54, as the optical waveguide core layer 1, at least one layer made of a material selected from a group comprised of single crystalline silicon, amorphous silicon, strained silicon, polycrystalline silicon, $Si_{1-x}Ge_x$ (hereinafter referred to simply as "$Si_{1-x}Ge_x$," wherein x=0.01~0.9), silicon nitride, or silicon oxynitride may be used. Meanwhile, as the semiconductor light absorbing layer 2, at least one layer made of a material selected from a group comprised of Ge, $Si_{1-x}Ge_x$, Si, InGaAs, GaN, GaAs, GaInP, and InP may be used. Further, as the MSM electrodes 3 and 4, at least one layer made of a material or an alloy layer made of at least two types of materials selected from aluminum, silver, gold, copper, tungsten, titanium, titanium nitride, and nickel may be used.

Figure 9:
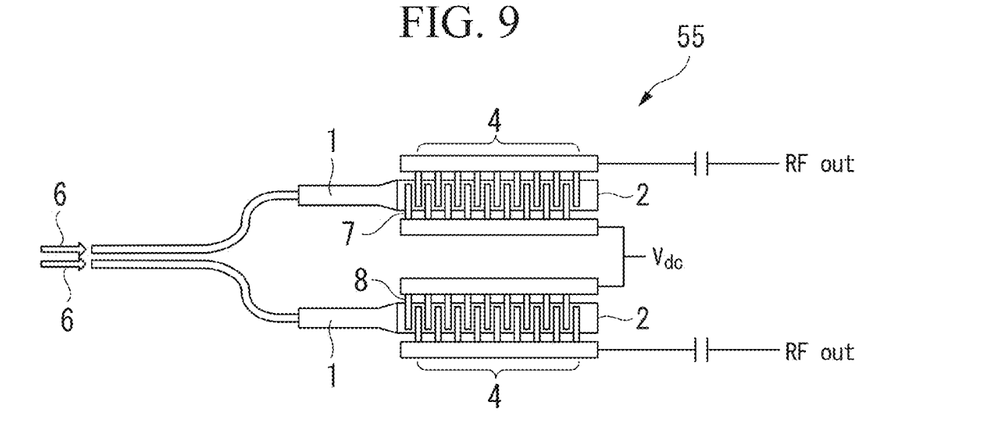
FIG. 9 is a configuration view when a waveguide-coupled MSM-type photodiode according to a fifth embodiment of the present invention optically coupled with differential optical signals is a balanced differential photodiode.
Figure 10:
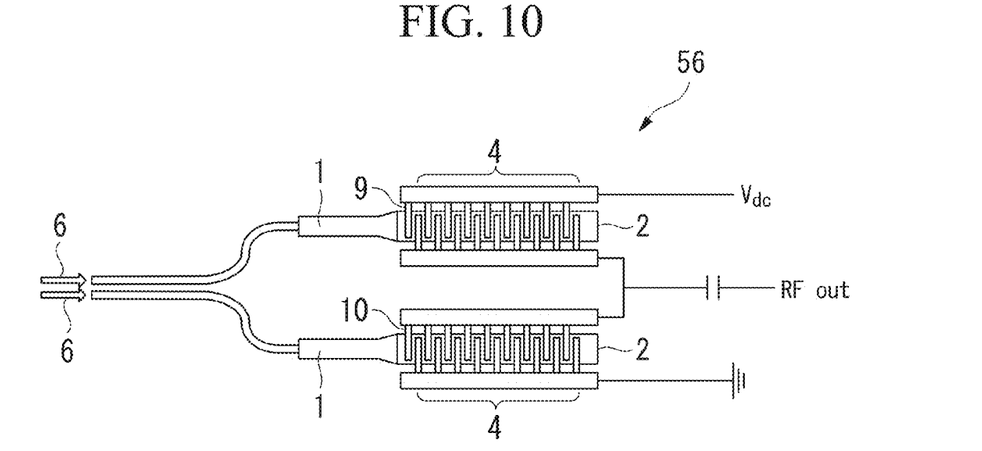
FIG. 10 is a configuration view when a waveguide-coupled MSM-type photodiode according to a sixth embodiment of the present invention optically coupled with differential optical signals is a dual differential photodiode.

FIGS. 9 and 10 are configuration views showing differential optical signals transmitted through two optical waveguides and an optical receiving circuit in which the waveguide-coupled MSM-type photodiode according to the present invention is optically coupled. FIG. 9 illustrates a receiving circuit configuration of a balanced differential optical receiver 55 according to a fifth embodiment of the present invention, and FIG. 10 shows a receiving circuit configuration of a dual differential optical receiver 56 according to a sixth embodiment of the present invention.

In the balanced differential optical receiver 55, since two MSM-type photodiodes are electrically connected in parallel as shown in FIG. 9, a voltage is set such that a reverse bias is applied to an MSM electrode (1-1) 7 arranged at a light incidence side and an MSM electrode (1-2) 8 in the two MSM-type photodiodes. In the differential optical receiver, a characteristic difference between two diodes commonly hinders a performance improvement. In the waveguide-coupled MSM-type photodiode according to the present invention, a setting is performed such that a reverse bias is applied as a bias voltage applied to the MSM electrode (1-1) 7 and the MSM electrode (1-2) 8 at the light incidence side (a differential optical signal 6 side) in the two photodiodes, and thus it is possible to match the frequency characteristic and light reception sensitivity, and it is possible to obtain an excellent differential output waveform.

Meanwhile, in the dual differential optical receiver 56, two MSM-type photodiodes are electrically connected in series as shown in FIG. 10. Further, the electrode arrangement is performed and a bias voltage is set such that a reverse bias is applied to an MSM electrode (1-3) 9 and an MSM electrode (1-4) 10 arranged at a light incidence side. Through this configuration, it is possible to match the frequency characteristic and light reception sensitivity in the two MSM-type photodiodes, and it is possible to obtain an excellent differential output waveform.

It is possible to configure an optical interconnection system on an LSI including one of the MSM-type photodiodes 51, 52, 53, and 54 of the above embodiments as a light receiving unit other than the above-described receiving circuit.

Figure 11:
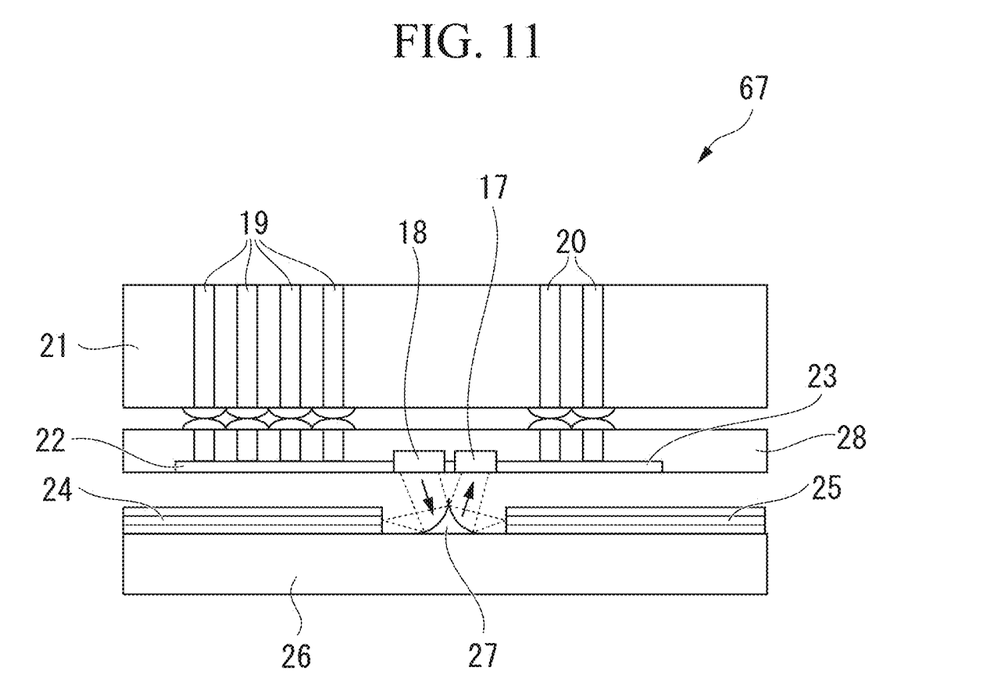
FIG. 11 is a configuration view of an optical interconnection module in which a waveguide-coupled MSM-type photodiode is mounted according to a seventh embodiment of the present invention.

FIG. 11 illustrates a configuration of an optical interconnection module 67 according to a seventh embodiment.

The optical interconnection module 67 includes a photodiode/light-source-mounted board (Si substrate) 28 in which a waveguide-coupled MSM-type photodiode 17 according to the present invention is formed and an LSI electronic circuit formed to be monolithic with the waveguide-coupled MSM-type photodiode 17 on the photodiode/light-source-mounted board 28 as shown in FIG. 11. The LSI electronic circuit includes a VCSEL light source 18 serving as a light source of the optical interconnection module 67, an electric interconnection layer 22 for light source modulation, an electric interconnection layer 23 for photodiode modulation, and the like.

Specifically, the optical interconnection module 67 includes the photodiode/light-source-mounted board 28, an LSI package 21, and an LSI-mounted board 26 as shown in FIG. 11. The LSI package 21 includes an electric interconnection via 19 for light source modulation and an electric interconnection via 20 for photodiode modulation. The LSI-mounted board 26 includes an optical signal input fiber 25, an optical signal output fiber 24, and a concave mirror 27.

In the optical interconnection module 67, the electric interconnection layer 22 for light source modulation is electrically connected with the electric interconnection via 19 for light source modulation. An electrical signal from an LSI passes through the electric interconnection layer 22 for light source modulation from the electric interconnection via 19 for light source modulation, and then is converted into an optical signal by the VCSEL light source 18 including an electric modulation mechanism. The optical signal is reflected by the concave mirror 27 and transferred to the optical signal output fiber 24. The VCSEL light source 18 may be replaced with another known light emitting mechanism that modulates light by electricity such as a Mach-Zehnder modulator that modulates light from an external light source by an electro-optical effect or a thermo-optical effect.

For an input of the optical signal, a known optical device such as a planar optical waveguide may be used instead of the optical signal input fiber 25. Further, a light condensing mechanism such as a convex lens may be used instead of the concave mirror 27. Further, a pre-amplifier that amplifies an electrical signal may be arranged in the middle of the electric interconnection layer 23 for photodiode modulation at a stage subsequent to the waveguide-coupled MSM-type photodiode 17.

The optical signal from the optical signal input fiber 25 is radiated to the waveguide-coupled MSM-type photodiode 17 by the concave mirror 27 and a grating coupler (not shown). The electric interconnection layer 23 for photodiode modulation that is in contact with the waveguide-coupled MSM-type photodiode 17 is electrically connected with the electric interconnection via 20 for photodiode modulation of the LSI. Thus, the optical signal received by the waveguide-coupled MSM-type photodiode 17 is converted into an electrical signal and then transferred to the LSI.

In an interconnection between relevant LSI chips, when high-speed operation of 20 GHz or higher is desired, in order to implement a high-speed response, for example, a compound semiconductor material such as InGaAs grown on an InP substrate is used for a photodiode mounted in a module. However, a compound semiconductor has a problem in that it is bad in compliance with a manufacturing process of a Si semiconductor device and high in cost.

According to the present embodiment, as the waveguide-coupled MSM-type photodiode 17 is provided, it is possible to increase the response speed of the optical interconnection module 67 and reduce the manufacturing cost.

(Manufacturing Method)

Next, a method of manufacturing the waveguide-coupled MSM-type photodiode according to the present invention will be described in connection with an example in which Ge is used for a semiconductor light absorbing layer. FIGS. 12A to 12G are cross-sectional views showing a method of manufacturing the waveguide-coupled MSM-type photodiode 51 according to the first embodiment of the present invention.

Figure 12A:
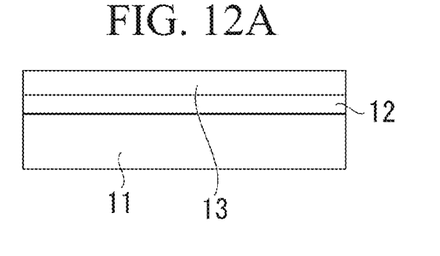
FIGS. 12A to 12G are cross-sectional views showing a method of manufacturing a waveguide-coupled MSM-type photodiode according to the present invention.

First, a non-doped SOI substrate in which a support substrate 11, an embedding oxide layer 12, and a non-doped semiconductor silicon 13 are stacked as shown in FIG. 12A is prepared. As the SOI substrate, a substrate having a sufficiently low doping concentration is desirable, and for example, a p-type SOI substrate having resistivity of 1 to 100 Ω·cm and a doping concentration of $10^{15}$ to $10^{16}/cm^3$ is assumed to be used in the present embodiment.

Figure 12B:
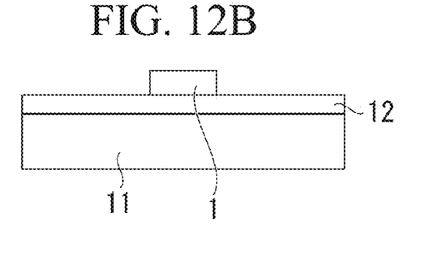

Then, as shown in FIG. 12B, resist patterning and reactive ion etching are performed by electron-beam lithography or light exposure to perform an optical waveguide core layer 1.

Figure 12C:
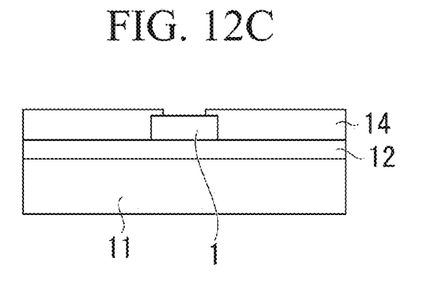

Then, as shown in FIG. 12C, a $SiO_2$ film is formed by a low pressure chemical vapor deposition (LPCVD) technique. Thereafter, an opening is formed in a Ge growth area by reactive ion etching, and an SOI layer surface is subjected to light exposure to form an oxide film mask 14 for selective Ge growth.

Figure 12D:
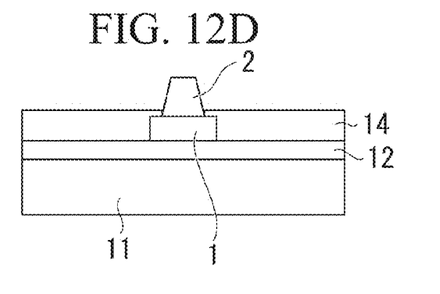

Then, as shown in FIG. 12D, a Ge film having a thickness of about 1 μm is formed on an opening portion of the oxide film mask 14 by an ultra high vacuum chemical vapor deposition (UHV-CVD) technique or the LPCVD technique. At this time, in order to reduce a leakage current occurring when an MSM electrode is formed, a Si layer is stacked on the Ge layer at a thickness of about 10 nm to 50 nm to form a semiconductor light absorbing layer 2.

Figure 12E:
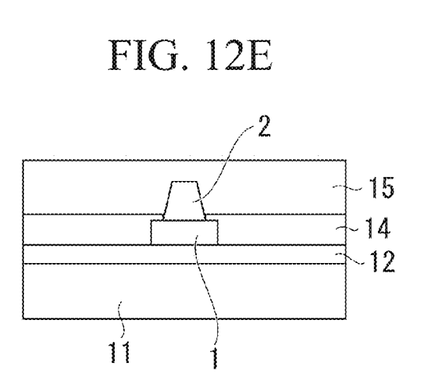
Figure 12F:
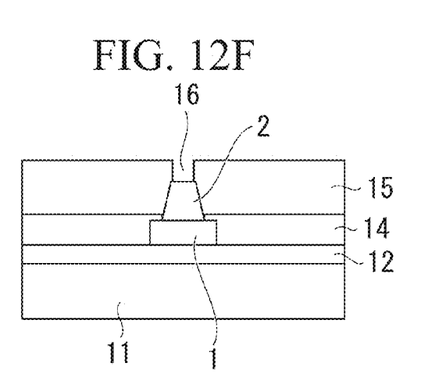

Then, as shown in FIG. 12E, an oxide film clad 15 covering the oxide film mask 14 and the semiconductor light absorbing layer 2 is deposited at a thickness of 1 μm. Then, as shown in FIG. 12F, a contact hole 16 is formed in a region in which an MSM electrode electrically comes into contact with the Ge/Si layer by optical lithography and reactive ion etching. For example, the contact hole 16 has a size of 1 μm×5 μm. Further, the spacing between contact holes is set to about 0.8 μm.

Figure 12G:
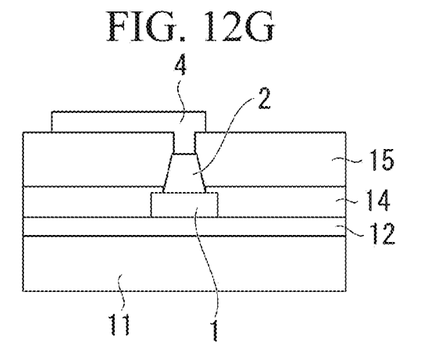

Lastly, as shown in FIG. 12G, a Ti/TiN/Al film serving as an MSM electrode material is formed at a thickness of about 1 μm by a sputtering technique to fill the contact hole. Thereafter, the Ti/TiN/Al film (1 μm) is processed by optical lithography and reactive ion etching to function as an MSM electrode.

The preferred embodiments of the present invention have been described above in detail, but the present invention is not limited to a relevant specific embodiment, and various modifications and changes may be made within a range of the gist of the present invention set forth in the appended claims.

EXAMPLES

Specific examples will be described below.

First Example

The waveguide-coupled MSM-type photodiode 51 according to the first embodiment of the present invention was manufactured by performing the process of FIGS. 12A to 12G.

In this example, a bias voltage was set such that a reverse bias was applied to the MSM electrode (1) 3 serving as a region to which an optical mode field initially shifted from the optical waveguide core layer 1 to the semiconductor light absorbing layer 2. Thus, it was possible to match a region in which the most photo carriers were generated by light absorption with a region in which an internal electric field by a reverse bias voltage was large, and high speed operation of 20 GHz and high reception efficiency of about 80% were obtained at a relatively low bias voltage of about −3 V.

Further, in this example, Si was used as the optical waveguide core layer 1, and Ge was used as the semiconductor light absorbing layer 2. It is known that when $Si_{1-x}Ge_x$ or Ge is formed on a Si layer by selective growth, a taper shape called a facet is generated. In this example, when an incident light wavelength was λ, and an effective refractive index of an optical signal field in the semiconductor light absorbing layer was $n_{eff}$, a distance between the MSM electrode (1) 3 arranged at the light incidence side among the MSM electrodes 3 and 4 arranged on the semiconductor light absorbing layer 2 at intervals and the edge portion 29 of the semiconductor light absorbing layer 2 was set to be $\lambda/n_{eff}$ or less. Thus, it was possible to reduce a leakage current increasing as an electrode was arranged on a facet and improve overlapping of an optical field distribution and an electric field distribution, and a speed increase and a reception efficiency were further improved. Further, as the $Si_{1-y}Ge_y$ (y=0~0.9) layer was formed on Ge and $Si_{1-x}Ge_x$ in order to reduce a leakage current, it was confirmed that crystal defects on Ge and $Si_{1-x}Ge_x$ were reduced.

Figure 13A:
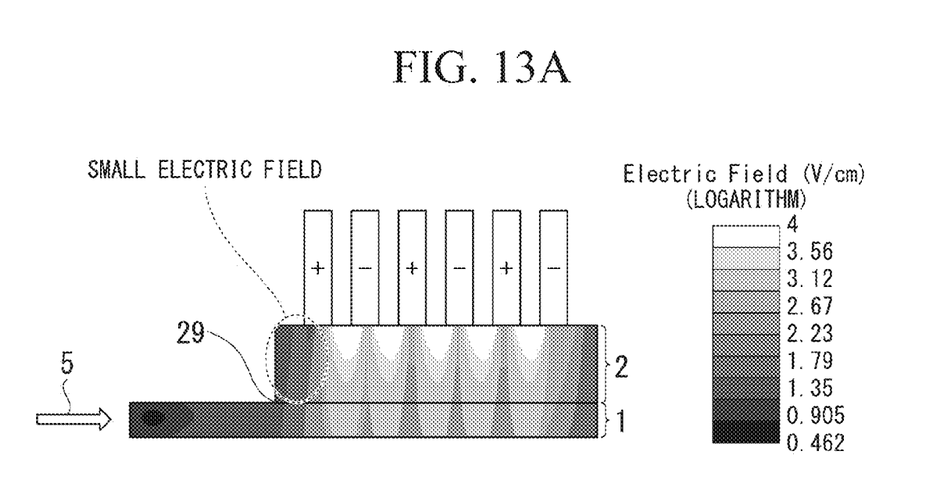
FIG. 13A is a diagram showing an electric field distribution in a semiconductor light absorbing layer when a forward bias was applied to an MSM electrode arranged at a light incidence side in a waveguide-coupled MSM-type photodiode according to the present invention.
Figure 13B:
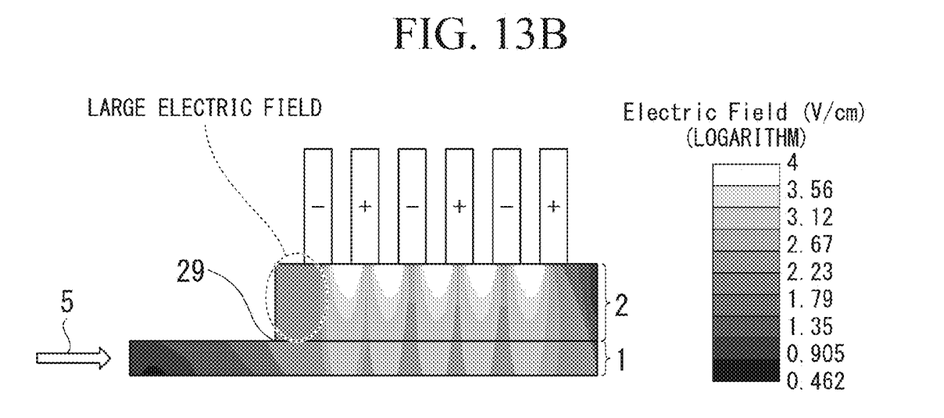
FIG. 13B is a diagram showing an electric field distribution in a semiconductor light absorbing layer when a reverse bias was applied to an MSM electrode arranged at a light incidence side in a waveguide-coupled MSM-type photodiode according to the present invention.

FIGS. 13A and 13B illustrate an electric field distribution when a forward bias of +1 V was applied to the MSM electrode (1) 3 arranged at the light incidence side as shown in FIG. 13A and an electric field distribution when a reverse bias of −1 V was applied to the MSM electrode (1) 3 arranged at the light incidence side as shown in FIG. 13B in the waveguide-coupled MSM-type photodiode formed on the semiconductor light absorbing layer 2 optically coupled with the adjacent optical waveguide core layer 1 through the manufacturing under the above conditions, respectively. At this time, the distance between the MSM electrodes was set to 1.0 μm, the optically coupled length was set to 30 μm, and the thickness of the Ge layer was set to 1 μm.

As can be seen from FIG. 13A, when the forward bias was applied, in an optically coupled portion of the semiconductor light absorbing layer, the internal electric field was decreased since an electric current flowed in the forward direction. However, when the reverse bias was applied as shown in FIG. 13B, the Schottky barrier was enhanced, and the internal electric field was increased as well. At this time, light absorption occurred the most and the most photo carriers were generated in the optically coupled portion of the semiconductor light absorbing layer. Thus, in the present invention, it was confirmed that as the internal electric field intensity in the photo carrier generation region was increased, the photo carrier transit time was reduced, the photodiode operating at a high speed was implemented, and a high light reception sensitivity was obtained at a low applied voltage.

Figure 14A:
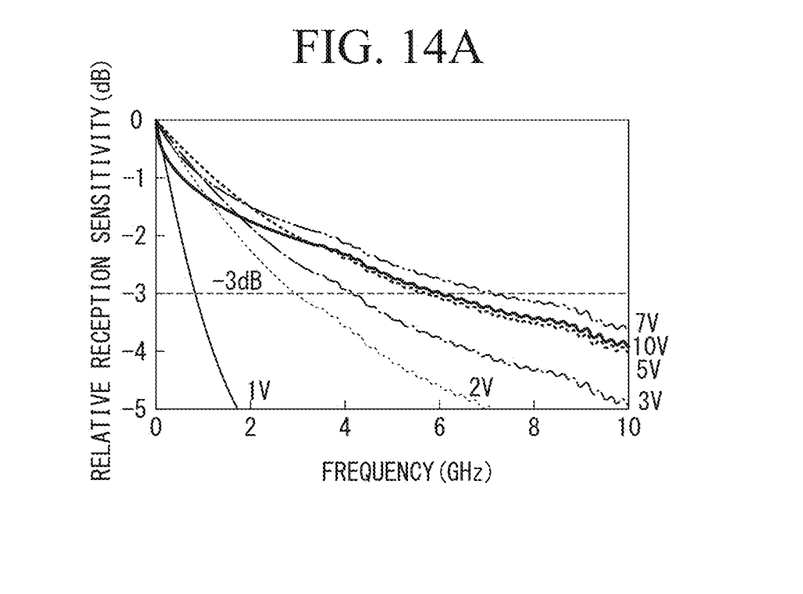
FIG. 14A is a diagram showing a frequency characteristic of reception sensitivity when a forward bias was applied to an MSM electrode arranged at a light incidence side in a waveguide-coupled MSM-type photodiode according to the present invention.
Figure 14B:
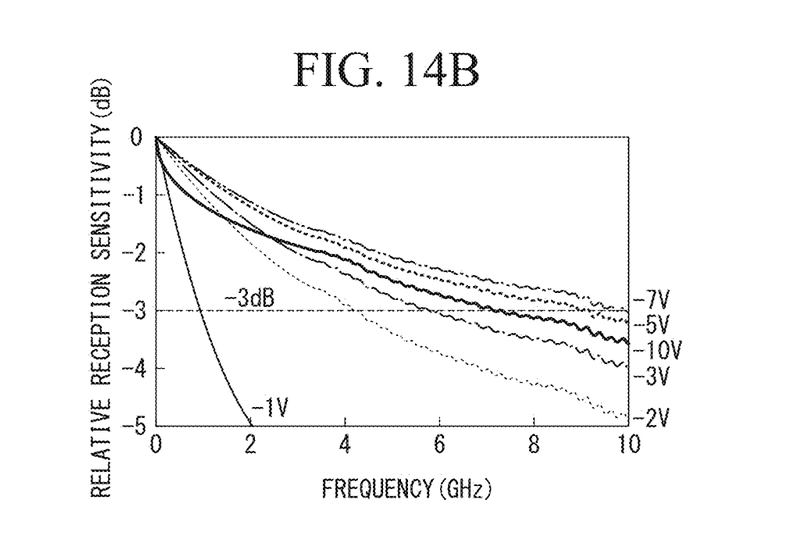
FIG. 14B is a diagram showing a frequency characteristic of reception sensitivity when a reverse bias was applied to an MSM electrode arranged at a light incidence side in a waveguide-coupled MSM-type photodiode according to the present invention.

FIGS. 14A and 14B illustrate a frequency characteristic of reception sensitivity when a forward bias was applied to the MSM electrode (1) 3 arranged at the light incidence side (FIG. 14A) and a frequency characteristic of reception sensitivity when a reverse bias was applied to the MSM electrode (1) 3 arranged at the light incidence side (FIG. 14B) in the waveguide-coupled MSM-type photodiode. When a forward bias of 5 V was applied, the frequency band was 6 GHz to 7 GHz, but when a reverse bias of −5 V was applied, the frequency band of the reception sensitivity was improved up to 10 GHz. In other words, it was confirmed that, in the waveguide-coupled MSM-type photodiode, when a voltage was set such that a reverse bias was applied to the MSM electrode (1) 3 arranged at the light incidence side, the internal electric field intensity in the photo carrier generation region was increased, and the frequency band was improved.

Second Example

In the waveguide-coupled MSM-type photodiode 52 according to the second embodiment of the present invention, the size of the MSM electrode (1) 3 arranged at the light incidence side was increased, and a bias voltage was set such that a reverse bias was applied. As a result, it was confirmed that in the photo carrier generation region of the optical coupling, a region in which the internal electric field intensity was strong was increased, and the reception sensitivity and the frequency band were improved.

The frequency band of the waveguide-coupled MSM-type photodiode 52 can be increased by reducing the distance between the MSM electrode 4 and the thickness of the semiconductor light absorbing layer 2. However, in order to realize the frequency band of 10 GHz or more required in an optical interconnection, it is necessary to cause a spacing between electrodes to be 1 μm or less, and a micro-fabrication process and high manufacturing accuracy are required. In this example, it was confirmed that the frequency band of 20 GHz or more was obtained by fixing a spacing between electrodes to 0.8 to 1.0 μm and setting the size of the MSM electrode (1) 3 arranged at the light incidence side to 1.2 to 1.5 μm.

Third Example

In the waveguide-coupled MSM-type photodiode 53 according to the third embodiment of the present invention, an interval between the MSM electrode (1) 3 arranged at the light incidence side and the adjacent MSM electrode 4 is made to be smaller as described above, and thus the internal electric field intensity in a photo carrier generation region of optical coupling is increased, and the reception sensitivity and the frequency band are improved. In this example, the distance between the MSM electrodes 4 was set to 0.8 μm, and the interval between the MSM electrode (1) 3 arranged at the light incidence side and the adjacent MSM electrode 4 was set to 0.6 μm. As a result, it was confirmed that the frequency band was improved from 12 GHz up to 15 GHz, the bias voltage was from −3 V to −2 V, and it was possible to implement the high-speed operation and the low power consumption.

Fourth Example

In the waveguide-coupled MSM-type photodiode 54 according to the fourth embodiment of the present invention, the high-speed operation of about 40 GHz was obtained by applying a reverse bias of −5 V to the MSM electrode (1) 3 of the light incident portion in which a huge number of photo carriers were generated. At this time, the interval between the MSM electrode interval was set to 0.5 μm.

Fifth Example

In the balanced differential optical receiver 55 according to the fifth embodiment of the present invention, the two waveguide-coupled MSM-type photodiodes were electrically connected in parallel, and thus a setting was performed so that a reverse bias voltage of −3 V was applied to the MSM electrode (1-1) 7 and the MSM electrode (1-2) 8. As described above, in the differential optical receiver, a characteristic difference between two photodiodes is commonly problematic. In the waveguide-coupled MSM-type photodiode of this example, a bias voltage was set such that a reverse bias was applied to the MSM electrode (1-1) 7 and the MSM electrode (1-2) 8 at the light incidence side in the two photodiodes, and thus it was possible to match the frequency characteristic and light reception sensitivity, and the excellent differential output waveform was obtained. Further, it was confirmed that, when integrated with an optical active device such as a modulator, an in-phase noise component was reduced, and it was possible to implement high integration of 1 Tbps/cm² to 10 Tbps/cm².

Sixth Example

In the dual differential optical receiver 56 according to the sixth embodiment of the present invention, an electrode arrangement was performed such that a reverse bias was applied to the MSM electrode (1-3) 9 and the MSM electrode (1-4) 10 arranged at the light incidence side, and a bias voltage of −6 V was set. As a result, it was possible to cause the two photodiodes to have almost the same frequency characteristics of 12.3 GHz and 12.5 GHz and to have almost the same light reception sensitivity of about 0.8 A/W as well. Further, an excellent differential output waveform was obtained. In addition, an excellent eye pattern of 10 Gpbs was obtained by a combination with an inverter-type transimpedance circuit.

Seventh Example

In the optical interconnection module 67 according to the seventh example of the present invention, high-speed photoelectric conversion operation of about 40 GHz was confirmed on a reverse bias voltage of −5 V.

Priority is claimed on Japanese Patent Application No. 2012-080591, filed Mar. 30, 2012, the content of which is incorporated herein by reference.

INDUSTRIAL APPLICABILITY

According to the waveguide-coupled MSM-type photodiode of the present invention, it is possible to implement a photodiode coupled with an optical waveguide with high efficiency and provide a device structure satisfying both the light reception sensitivity and the high speed operation at a low voltage.

DESCRIPTION OF REFERENCE SYMBOLS

1 Optical waveguide core layer
2 Semiconductor light absorbing layer
3 MSM electrode (1)
4 MSM electrode
5 Input optical signal
6 Differential optical signal
7 MSM electrode (1-1)
8 MSM electrode (1-2)
9 MSM electrode (1-3)
10 MSM electrode (1-4)
11 Support substrate
12 Embedding oxide layer
13 Non-doped semiconductor silicon
14 Oxide film mask
15 Oxide film clad
16 Contact hole
17 Waveguide-coupled MSM-type photodiode
18 VCSEL light source
19 Electric interconnection via for light source and modulation
20 Electric interconnection via for photodiode
21 LSI package
22 Electric interconnection layer for light source modulation
23 Electric interconnection layer for photodiode
24 Optical signal output fiber
25 Optical signal input fiber
26 LSI-mounted board
27 Concave minor
28 Photodiode/light-source-mounted board
29 Edge portion
51 MSM-type photodiode
52 MSM-type photodiode
53 MSM-type photodiode
54 MSM-type photodiode
55 Balanced differential optical receiver
56 Dual differential optical receiver
67 Optical interconnection module

The invention claimed is:

1. A waveguide-coupled metallic-semiconductor-metallic (MSM)-type photodiode comprising:
   a semiconductor light absorbing layer arranged to be adjacent to an optical waveguide core layer, the optical waveguide core layer being optically coupled with the semiconductor light absorbing layer; and
   MSM junctions configured to be formed on the semiconductor light absorbing layer, the MSM junctions being arranged at intervals;
   wherein a voltage is set such that a reverse bias is applied to an MSM electrode of a MSM junction arranged at a light incidence side among MSM electrodes of the MSM junctions arranged at intervals, and
   wherein a distance between the MSM electrode arranged at the light incidence side among the MSM electrodes arranged at the intervals on the semiconductor light absorbing layer and an edge portion of the semiconductor absorbing layer is $\lambda/n_{\it eff}$ or less than when $\lambda$ is an incident light wavelength, and $n_{\it eff}$ is an effective refractive index of an optical signal field in the semiconductor light absorbing layer.

2. The waveguide-coupled MSM-type photodiode according to claim 1,
   wherein a width of the MSM electrode arranged at the light incidence side among the MSM electrodes arranged at the intervals on the semiconductor light absorbing layer is greater than that of the other MSM electrodes.

3. The waveguide-coupled MSM-type photodiode according to claim 2,
   wherein an interval between the MSM electrode arranged at the light incidence side among the MSM electrodes arranged at the intervals on the semiconductor light absorbing layer and an adjacent MSM electrode is smaller than an interval between the other adjacent MSM electrodes.

4. The waveguide-coupled MSM-type photodiode according to claim 2,
   wherein the semiconductor light absorbing layer and the optical waveguide core layer are stacked and optically coupled on a substrate in a vertical direction.

5. The waveguide-coupled MSM-type photodiode according to claim 1,
   wherein an interval between the MSM electrode arranged at the light incidence side among the MSM electrodes arranged at the intervals on the semiconductor light absorbing layer and an adjacent MSM electrode is smaller than an interval between the other adjacent MSM electrodes.

6. The waveguide-coupled MSM-type photodiode according to claim 5,
   wherein the semiconductor light absorbing layer and the optical waveguide core layer are stacked and optically coupled on a substrate in a vertical direction.

7. The waveguide-coupled MSM-type photodiode according to claim 1,
   wherein the semiconductor light absorbing layer and the optical waveguide core layer are stacked and optically coupled on a substrate in a vertical direction.

8. The waveguide-coupled MSM-type photodiode according to claim 1,
   wherein the semiconductor light absorbing layer and the optical waveguide core layer are adjacent and optically coupled on a substrate in a horizontal direction.

9. An optical receiving circuit, comprising:
a waveguide-coupled MSM-type photodiode according to claim 1,
wherein the waveguide-coupled MSM-type photodiode is optically coupled with differential optical signals transmitted through two optical waveguides.

10. The optical receiving circuit according to claim 9,
wherein the waveguide-coupled MSM-type photodiode optically coupled with the differential optical signals is a balanced differential photodiode.

11. The optical receiving circuit according to claim 9,
wherein the waveguide-coupled MSM-type photodiode optically coupled with the differential optical signals is a dual differential photodiode.

12. The waveguide-coupled MSM-type photodiode according to claim 1,
wherein the optical waveguide core layer includes at least one layer made of a material selected from a group comprised of single crystalline silicon, amorphous silicon, strained silicon, polycrystalline silicon, $Si_{1-x}Ge_x$ (x=0.01~0.9), silicon nitride, and silicon oxynitride.

13. The waveguide-coupled MSM-type photodiode according to claim 1,
wherein the semiconductor light absorbing layer includes at least one layer made of a material selected from a group comprised of Ge, $Si_{1-x}Ge_x$ (x=0.01~0.9), Si, InGaAs, GaN, GaAs, GaInP, and InP.

14. The waveguide-coupled MSM-type photodiode according to claim 1,
wherein in the photodiode, when the semiconductor light absorbing layer includes Ge and $Si_{1-x}Ge_x$ (x=0.01~0.9), a $Si_{1-y}Ge_y$ (y=0~0.9) layer is stacked on Ge and $Si_{1-x}Ge_x$ (x=0.01~0.9) in order to form a Schottky junction.

15. The waveguide-coupled MSM-type photodiode according to claim 1,
wherein the MSM electrodes arranged at the intervals on the semiconductor light absorbing layer include at least one layer made of a material or an alloy layer made of at least two materials selected from aluminum, silver, gold, copper, tungsten, titanium, titanium nitride, and nickel.

16. An optical interconnection system on an LSI, comprising:
a light receiving unit including the photodiode according to claim 1.

17. An optical interconnection module, comprising:
a Si substrate including the photodiode according to claim 1 formed thereon; and
an LSI electronic circuit monolithically formed with the photodiode on the Si substrate.

18. A waveguide-coupled metallic-semiconductor-metallic (MSM)-type photodiode comprising:
a semiconductor light absorbing layer arranged to be adjacent to an optical waveguide core layer, the optical waveguide core layer being optically coupled with the semiconductor light absorbing layer; and
MSM junctions configured to be formed on the semiconductor light absorbing layer, the MSM junctions being arranged at intervals;
wherein a voltage is set such that a reverse bias is applied to an MSM electrode of a MSM junction arranged at a light incidence side among MSM electrodes of the MSM junctions arranged at intervals,
wherein a width of the MSM electrode arranged at the light incidence side among the MSM electrodes arranged at the intervals on the semiconductor light absorbing layer is greater than that of the other MSM electrodes, and
wherein a distance between the MSM electrode arranged at the light incidence side among the MSM electrodes arranged at the intervals on the semiconductor light absorbing layer and an edge portion of the semiconductor absorbing layer is $\lambda/n_{eff}$ or less than when $\lambda$ is an incident light wavelength, and $n_{eff}$ is an effective refractive index of an optical signal field in the semiconductor light absorbing layer.

19. A waveguide-coupled metallic-semiconductor-metallic (MSM)-type photodiode comprising:
a semiconductor light absorbing layer arranged to be adjacent to an optical waveguide core layer, the optical waveguide core layer being optically coupled with the semiconductor light absorbing layer; and
MSM junctions configured to be formed on the semiconductor light absorbing layer, the MSM junctions being arranged at intervals;
wherein a voltage is set such that a reverse bias is applied to an MSM electrode of a MSM junction arranged at a light incidence side among MSM electrodes of the MSM junctions arranged at intervals,
wherein a distance between the MSM electrode arranged at the light incidence side among the MSM electrodes arranged at the intervals on the semiconductor light absorbing layer and an edge portion of the semiconductor absorbing layer is $\lambda$/neff or less than when $\lambda$ is an incident light wavelength, and neff is an effective refractive index of an optical signal field in the semiconductor light absorbing layer, and
wherein the semiconductor light absorbing layer and the optical waveguide core layer are stacked and optically coupled on a substrate in a vertical direction.

* * * * *